(12) United States Patent
Oh (10) Patent No.: US 8,456,881 B2
(45) Date of Patent: Jun. 4, 2013

(54) STACKED MEMORY AND DEVICES INCLUDING THE SAME

(75) Inventor: Chi Sung Oh, Gunpo-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 206 days.

(21) Appl. No.: 13/007,716

(22) Filed: Jan. 17, 2011

(65) Prior Publication Data

US 2011/0242870 A1   Oct. 6, 2011

(30) Foreign Application Priority Data

Mar. 31, 2010  (KR) ........................ 10-2010-0028985

(51) Int. Cl.
*G11C 5/02* (2006.01)

(52) U.S. Cl.
USPC .............. 365/51; 365/63; 257/784; 257/777; 257/691

(58) Field of Classification Search
USPC ........................ 365/51, 63; 257/784, 777, 691
See application file for complete search history.

(56) References Cited

U.S. PATENT DOCUMENTS

2010/0270668 A1* 10/2010 Marcoux ........................ 257/690
2011/0102015 A1*  5/2011 Kuroda ............................ 326/37

* cited by examiner

*Primary Examiner* — Thong Q Le
(74) *Attorney, Agent, or Firm* — Harness, Dickey & Pierce, P.L.C.

(57) ABSTRACT

In one embodiment, the stacked memory includes a first group of stacked memory chips, a second group of stacked memory chips, and connection terminals configured to electrically connect a first memory chip among the stacked memory chips in the first group to a second memory chip among the stacked memory chips in the second group.

20 Claims, 14 Drawing Sheets

STACKED MEMORY AND DEVICES INCLUDING THE SAME

CROSS-REFERENCE TO RELATED APPLICATIONS

This application claims priority under 35 U.S.C. §119 to Korean Patent Application No. 10-2010-0028985 filed on Mar. 31, 2010, in the Korean Intellectual Property Office (KIPO), the disclosure of which is hereby incorporated by reference in its entirety.

BACKGROUND

1. Field

Example embodiments of the present invention relate to a stacked memory, and more particularly, to a stacked memory having different densities of channels and devices including the same.

2. Description of the Related Art

Multi-chip packages (MCPs) are packages that include a plurality of chips. They allow necessary memories to be combined according to application products and greatly contribute to space efficiency of mobile communication devices such as cellular phones.

In a three-dimensional (3D) stacking method among methods of manufacturing an MCP, a plurality of chips are vertically stacked and connected to one another using a plurality of through-silicon vias (TSVs). When MCPs are manufactured using the 3D stacking method, metal wires for electrically connecting chips to each other are not required, and therefore, small, high-speed and low-power-consumption MCPs can be manifested.

SUMMARY

Example embodiments of the present invention provide a stacked memory having different densities of channels and devices including the same.

In accordance with an example embodiment of the present invention, a semiconductor device may include a first group of stacked semiconductor chips and a second group of stacked semiconductor chips. In this example embodiment, the first group may include a first semiconductor chip and the second group may include a second semiconductor chip and a third semiconductor chip. In this example embodiment, the second and third semiconductor chips may be electrically isolated from each other and the first semiconductor chip may be electrically connected to the second semiconductor chip.

According to an example embodiment of the present invention, there is provided a stacked memory including a first group of stacked memory chips, a second group of stacked memory chips, and connection terminals configured to electrically connect a first memory chip among the stacked memory chips in the first group to a second memory chip among the stacked memory chips in the second group.

When the number of stacked memory chips in the first group is N and the number of stacked memory chips in the second group is N, the first memory chip and the second memory chip may be an i-th memory chip in the first and second groups, respectively, where N is a natural number and $2 \leq i \leq N$. When the number of stacked memory chips in the second group is N and the second memory chip is an i-th memory chip in the second group, the i-th memory chip may be electrically isolated from an (i−1)-th memory chip in the second group, where N is a natural number and $2 \leq i \leq N$.

The stacked memory chips in the first group may be electrically connected to one another through a plurality of first through silicon vias (TSVs) and the i-th through N-th memory chips among the stacked memory chips in the second group may be electrically connected to one another through a plurality of second TSVs. The stacked memory chips in the first group and the stacked memory chips in the second group may have the same chip configuration.

The stacked memory may further include a circuit board configured to transfer data to the stacked memory chips in the first group and the stacked memory chips in the second group and transfer data from the stacked memory chips in the first group and the stacked memory chips in the second group.

According to other example embodiments of the present invention, there is provided a multi-chip package including the above-described stacked memory.

According to further example embodiments of the present invention, there is provided a memory module including the above-described stacked memory and a module board on which the stacked memory is mounted.

In other example embodiments, a memory system includes a stacked memory including N stacked first memory chips and N stacked second memory chips where N is a natural number; a first central processing unit (CPU) configured to access "j" memory chips among the N stacked second memory chips and the N stacked second memory chips where "j" is a natural number and j and a second CPU configured to access the remaining (N−j) memory chips among the N stacked second memory chips. The stacked memory may further include a connection terminal configured to electrically connect an i-th memory chip among the N stacked first memory chips to an i-th memory chip among the N stacked second memory chips where $2 \leq i \leq N$.

BRIEF DESCRIPTION OF THE DRAWINGS

The above and other features and advantages of the present invention will become more apparent by describing in detail example embodiments thereof with reference to the attached drawings in which.

DETAILED DESCRIPTION OF THE EXAMPLE EMBODIMENTS

Example embodiments of the present invention now will be described more fully hereinafter with reference to the accompanying drawings, in which example embodiments of the invention are shown. The invention may, however, be embodied in many different forms and should not be construed as limited to the example embodiments set forth herein. Rather, the example embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements that may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
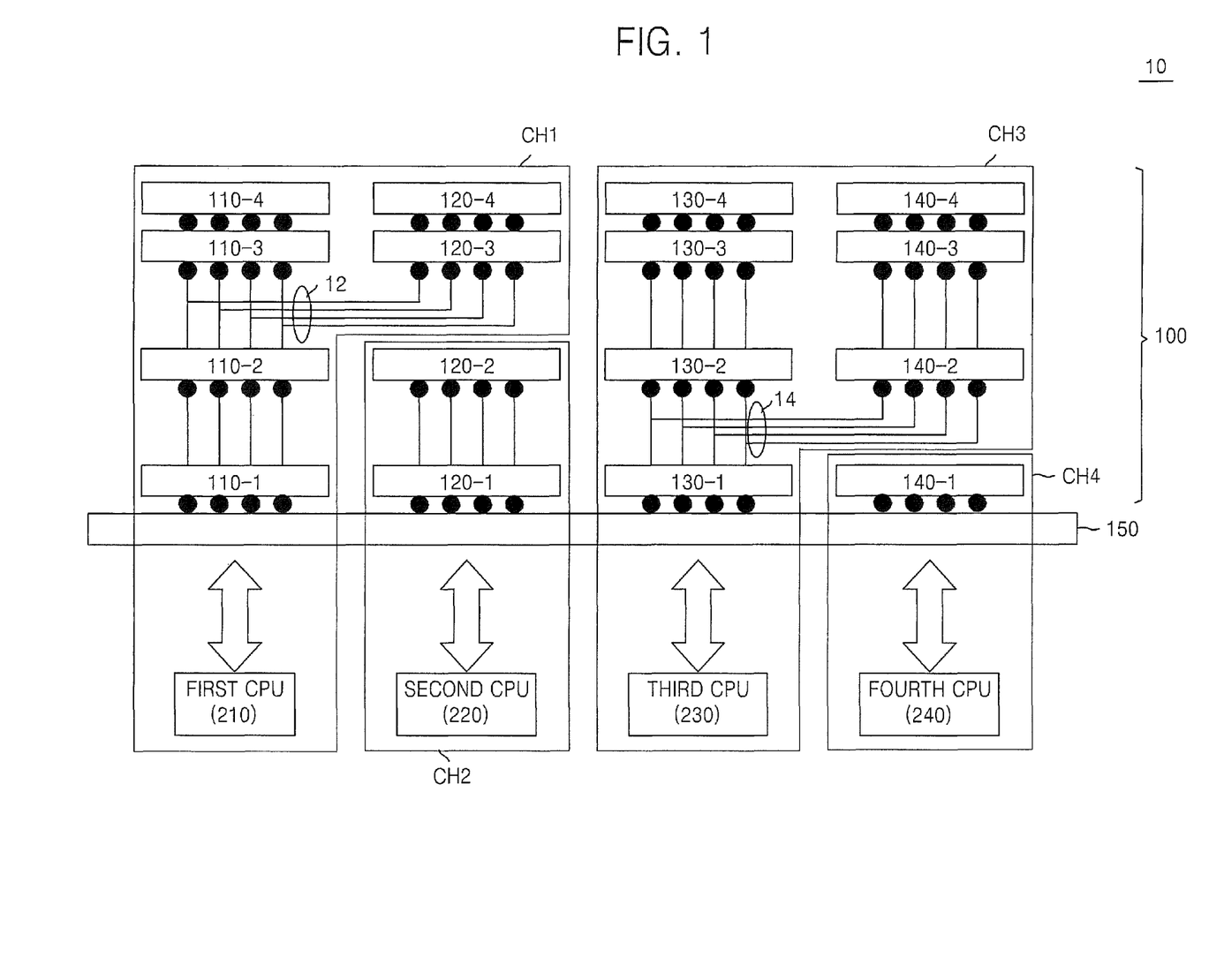
FIG. 1 is a block diagram of a memory system according to an example embodiment of the present invention.

FIG. 1 is a block diagram of a memory system 10 according to an example embodiment of the present invention. The memory system includes a stacked memory 100 and a plurality of processors, e.g., first through fourth central processing units (CPUs) 210 through 240.

The stacked memory 100 includes a first group 110 of stacked memory chips 110-1 through 110-4, a second group 120 of stacked memory chips 120-1 through 120-4, a third group 130 of stacked memory chips 130-1 through 130-4, a fourth group 140 of stacked memory chips 140-1 through 140-4, first connection terminals 12, and second connection terminals 14. The stacked memory 100 may also include a circuit board 150.

The stacked memory chips 110-1 through 110-4 in the first group 110 are electrically connected to one another through connection terminals, e.g., through-silicon vias (TSVs), metal wires, or solder bumps. Among the stacked memory chips 120-1 through 120-4 in the second group 120, only some memory chips, e.g., 120-1 and 120-2, are electrically connected to each other through connection terminals while the other memory chips, e.g., 120-3 and 120-4, are electrically connected to each other through other connection terminals. In this example embodiment, the memory chips 120-2 and 120-3 are electrically isolated from each other.

The first connection terminals 12 electrically connect one memory chip, e.g., 110-3, among the stacked memory chips 110-1 through 110-4 in the first group 110 to one memory chip, e.g., 120-3, among the stacked memory chips 120-1 through 120-4 in the second group 120. The first connection terminals 12 may be metal wires.

The stacked memory chips 110-1 through 110-4 in the first group 110, the memory chips 120-3 and 120-4 in the second group 120, and the first processor, i.e., the first CPU 210 form a first channel CH1. The memory chips 120-1 and 120-2 in the second group 120 and the second processor, i.e., the second CPU 220 form a second channel CH2.

The stacked memory chips 130-1 through 130-4 in the third group 130 are electrically connected to one another through connection terminals, e.g., TSVs, metal wires, or solder bumps. In the fourth group 140, all memory chips 140-1 through 140-4 except for the memory chip 140-1 are electrically connected to one another through connection terminals, e.g., TSVs, metal wires, or solder bumps.

The second connection terminals 14 electrically connect one memory chip, e.g., 130-2, among the stacked memory chips 130-1 through 130-4 in the third group 130 to one memory chip, e.g., 140-2, among the stacked memory chips 140-1 through 140-4 in the fourth group 140. The second connection terminals 14 may be metal wires.

The stacked memory chips 130-1 through 130-4 in the third group 130, the memory chips 140-2 through 140-4 in the fourth group 140, and the third processor, i.e., the third CPU 230 form a third channel CH3. The memory chip 140-1 in the fourth group 140 and the fourth processor, i.e., the fourth CPU 240 form a fourth channel CH4.

Each of the memory chips 110-1 through 110-4, 120-1 through 120-4, 130-1 through 130-4, and 140-1 through 140-4 may be implemented by a memory device including a volatile memory cell such as a DRAM cell. Alternatively, each of the memory chips 110-1 through 110-4, 120-1 through 120-4, 130-1 through 130-4, and 140-1 through 140-4 may be implemented by a memory device including a non-volatile memory cell. The non-volatile memory cell may be an electrically erasable programmable read-only memory (EEPROM) cell, a flash memory cell, a magnetic random access memory (MRAM) cell, a spin-transfer torque MRAM cell, a conductive bridging RAM (CBRAM) cell, a ferroelectric RAM (FeRAM) cell, a phase-change RAM (PRAM) cell, a resistive RAM (RRAM or ReRAM) cell, a nanotube RAM (NRAM) cell, a polymer RAM (PoRAM) cell, a nano floating gate memory (NFGM) cell, a holographic memory cell, a molecular electronics memory device cell, or an insulator resistance change memory cell. The non-volatile memory cell may store a single bit or multiple bits. In example embodiments, each of the memory chips 110-1 through 110-4, 120-1 through 120-4, 130-1 through 130-4, and 140-1 through 140-4 may be semiconductor chips.

As illustrated in FIG. 1, the first through fourth channels CH1 through CH4 respectively include six, two, seven and one memory chips. Here, a "channel" may be a group of physical elements that can process data independently or may simply be a group of memory chips. When two memory chips, e.g., 120-2 and 120-3 or 140-1 and 140-2 belong to the same group, e.g., the second group 120 or the fourth group 140 but belong to different channels, e.g., CH1 and CH2 or CH3 and CH4, respectively, the two memory chips 120-2 and 120-3 or 140-1 and 140-2 are electrically isolated from each other. The first through fourth groups 110 through 140 include the same number of memory chips, the memory chips have the same configuration.

The circuit board 150 may transfer data or control signals between the channels CH1 through CH4 and the processors 210 through 240.

Although FIG. 1 illustrates the memory system 10 including the four channels CH1 through CH4 in the stacked memory 100, the basic structure of the memory system 10 includes two channels. For instance, the stacked memory 100 may include the first channel CH1 and the second channel CH2 and the memory system 10 may include the first group 110 of the memory chips 110-1 through 110-4 for forming the first channel 1 and the second group 120 of the memory chips 120-1 through 120-4 for forming the second channel CH2.

The first through fourth channels CH1 through CH4 may include different numbers of memory chips and thus have different memory capacities or densities. Since the memory chips 110-1 through 110-4, 120-1 through 120-4, 130-1 through 130-4, and 140-1 through 140-4 included in the stacked memory 100 have the same configuration, the memory capacity or density of each channel CH1, CH2, CH3, or CH4 is proportional to the number of memory chips included therein.

Figure 2A:
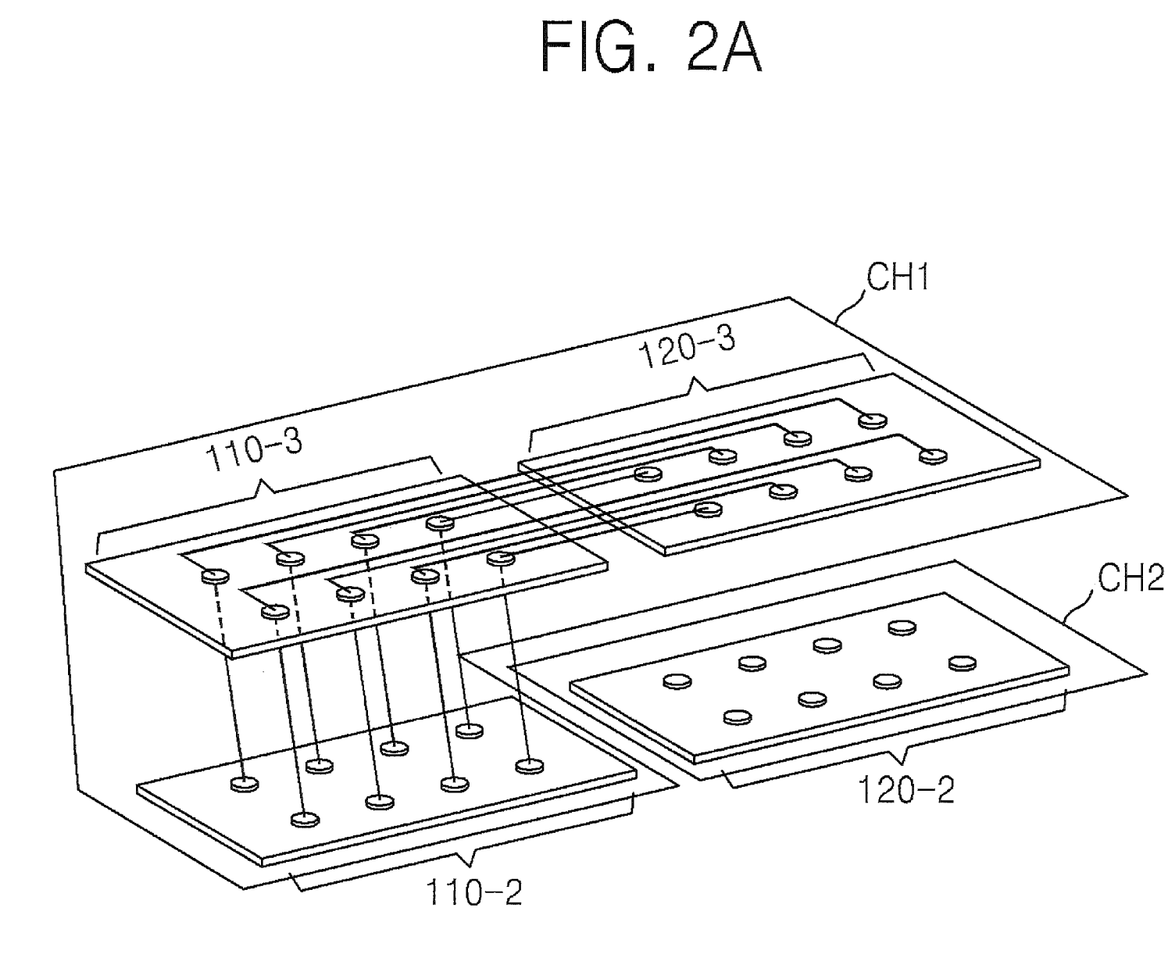
FIGS. 2A and 2B are diagrams showing the connection among memory chips of a stacked memory illustrated in FIG. 1.
Figure 2B:
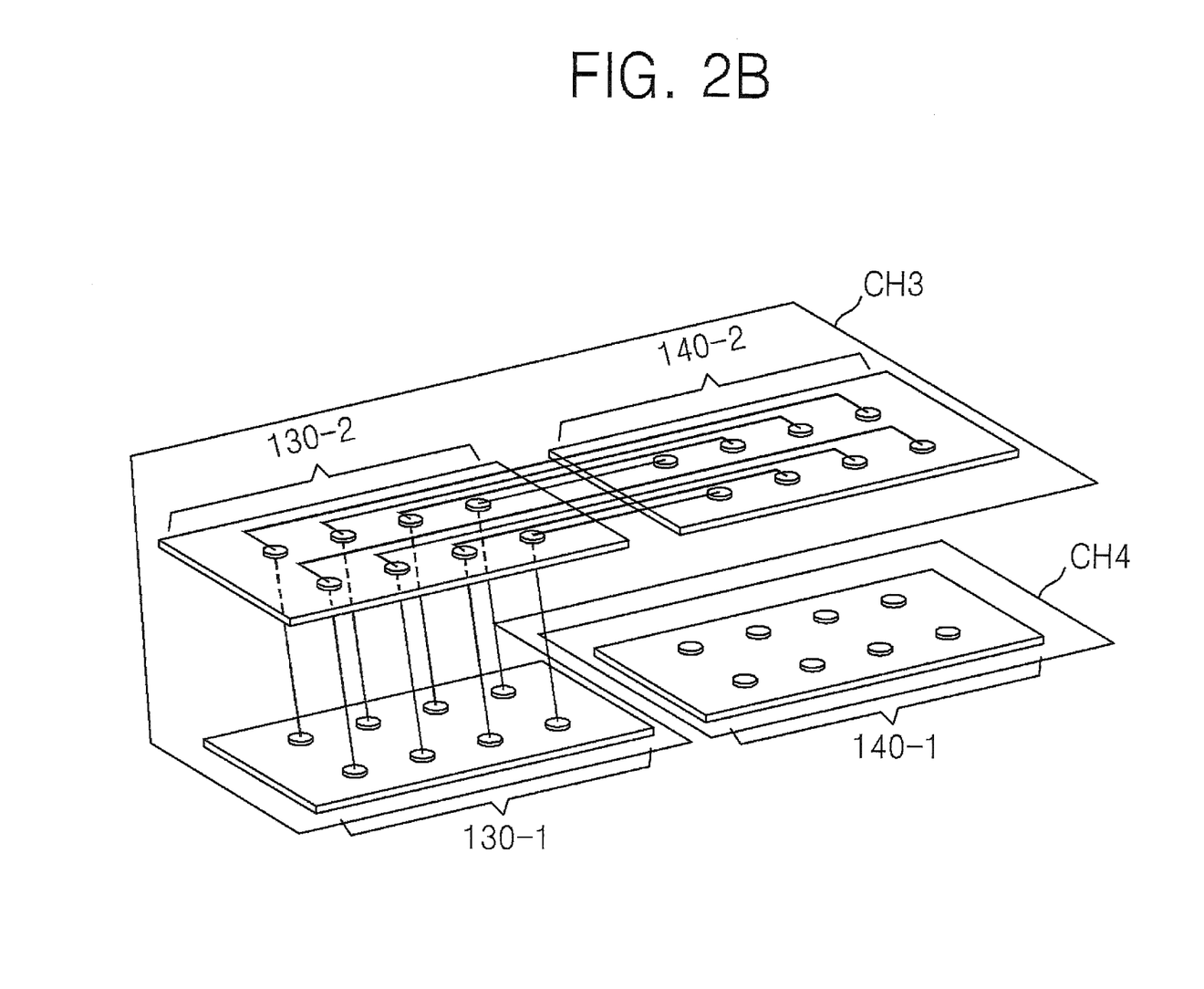

FIGS. 2A and 2B are diagrams showing the connection among memory chips of the stacked memory 100 illustrated in FIG. 1. Referring to FIG. 1, the memory chips 110-1 through 110-4, 120-1 through 120-4, 130-1 through 130-4, and 140-1 through 140-4 are electrically connected and isolated by channels. FIG. 2A shows the structure in which the memory chips 110-3 and 120-3 which belong to the same channel but belong to different groups are connected to each other through the connection terminal 12. FIG. 2B shows the structure in which the memory chips 130-2 and 140-2 which belong to the same channel but belong to different groups are connected to each other through the connection terminal 14.

Referring to FIGS. 1 and 2A, the memory chip 110-3 is stacked on the memory chip 110-2 in the first group 110 and the memory chip 120-3 is stacked on the memory chip 120-2 in the second group 120. In this example embodiment, the memory chip 110-2 in the first group 110 and the memory chip 120-2 in the second group 120 may be implemented on the same plane and the memory chip 110-3 in the first group 110 and the memory chip 120-3 in the second group 120 may be implemented on the same plane. In other words, memory chips 110-$i$, 120-$i$, 130-$i$, and 140-$i$ (where $1 \leq i \leq 4$) may be implemented on the same plane. Although FIG. 1 provides an example in which the number of memory chips of each group is 4, the invention is not limited thereto as there may be N number of memory chips provided in each group where N is a natural number.

Although the memory chip 120-3 is included in the second group 120, it is included in the first channel CH1, and therefore, it is electrically connected with the memory chip 110-3 in the first group 110 through the first connection terminals 12. As shown in FIG. 2A, solder bumps of the memory chip 110-3 may be connected with the solder bumps of the memory chip 120-3 through metal wires. Accordingly, the memory chip 120-3 included in the second group 120 is included in the first channel CH1. At this time, the memory chip 120-3 included in the first channel CH1 is electrically isolated from the memory chips 120-1 and 120-2 included in the second channel CH2. In addition, the memory chip 120-4 electrically connected with the memory chip 120-3 is also included in the first channel CH1.

Referring to FIGS. 1 and 2B, the memory chip 130-2 is stacked on the memory chip 130-1 in the third group 130 and the memory chip 140-2 is stacked on the memory chip 140-1 in the fourth group 140. In this example embodiment, the memory chip 130-1 in the third group 130 and the memory chip 140-1 in the fourth group 140 may be implemented on the same plane and the memory chip 130-2 in the third group 130 and the memory chip 140-2 in the fourth group 140 may be implemented on the same plane.

Although the memory chip 140-2 is included in the fourth group 140, it is included in the third channel CH3, and therefore, it is electrically connected with the memory chip 130-2 in the third group 130 through the second connection terminals 14. As shown in FIG. 2B, solder bumps of the memory chip 130-2 may be connected with the solder bumps of the memory chip 140-2 through metal wires. Accordingly, the memory chip 140-2 included in the fourth group 140 is included in the third channel CH3. In this example embodiment, the memory chip 140-2 included in the third channel CH3 is electrically isolated from the memory chip 140-1 included in the fourth channel CH4. In addition, since the memory chip 140-2 is electrically connected with the memory chips 140-3 and 140-4, the memory chips 140-3 and 140-4 are also included in the third channel CH3.

Figure 3A:
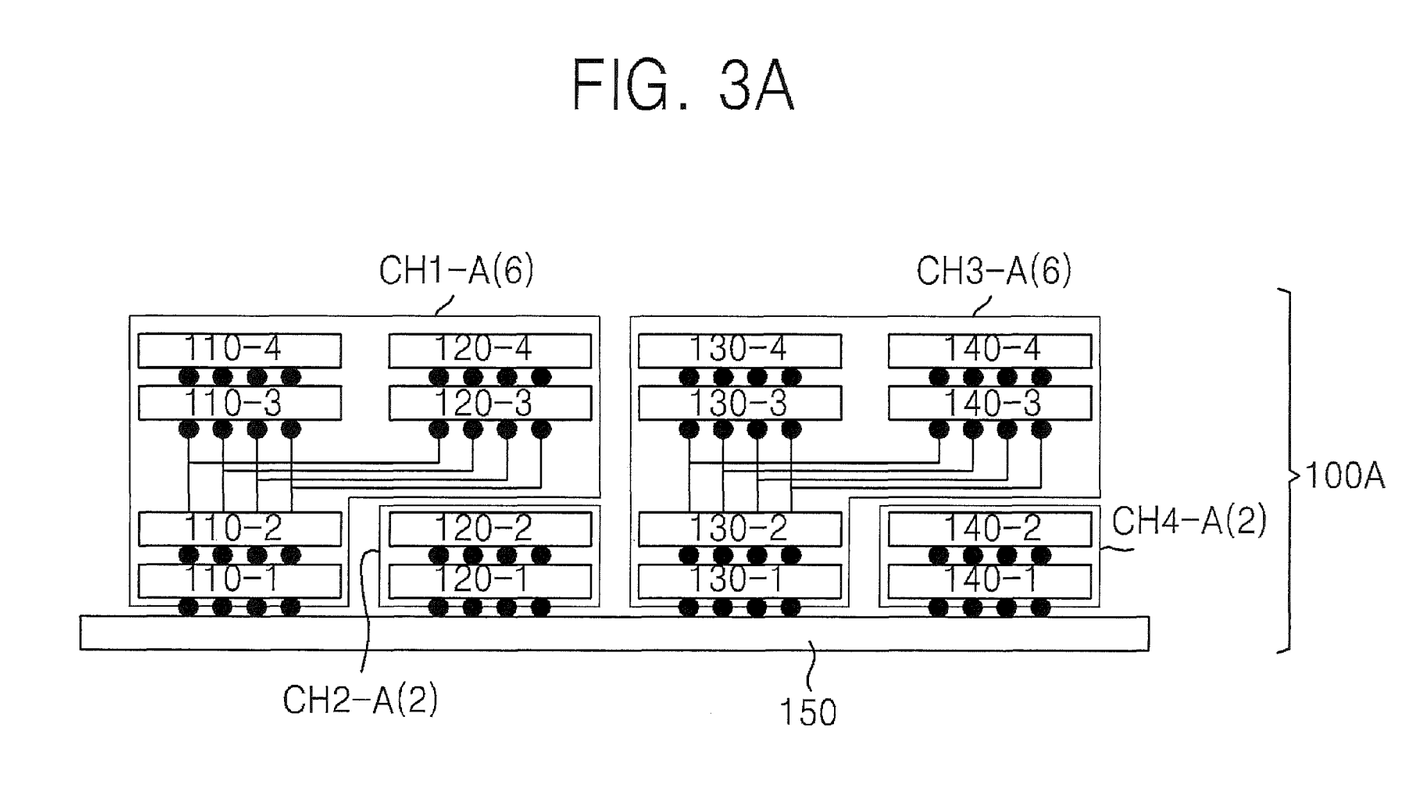
FIGS. 3A through 3I are diagrams of stacked memories according to different example embodiments of the present invention.

FIGS. 3A through 3I are diagrams of stacked memories according to various example embodiments of the present invention. Referring to FIG. 3A, a stacked memory 100A includes a first channel CH1-A including six memory chips 110-1 through 110-4, 120-3, and 120-4; a second channel CH2-A including two memory chips 120-1 and 120-2; a third channel CH3-A including six memory chips 130-1 through 130-4, 140-3, and 140-4; and a fourth channel CH4-A including two memory chips 140-1 and 140-2. The memory chip 110-3 in the first group 110 is electrically connected with the memory chip 120-3 in the second group 120 and the memory chip 130-3 in the third group 130 is electrically connected with the memory chip 140-3 in the fourth group 140.

Figure 3B:
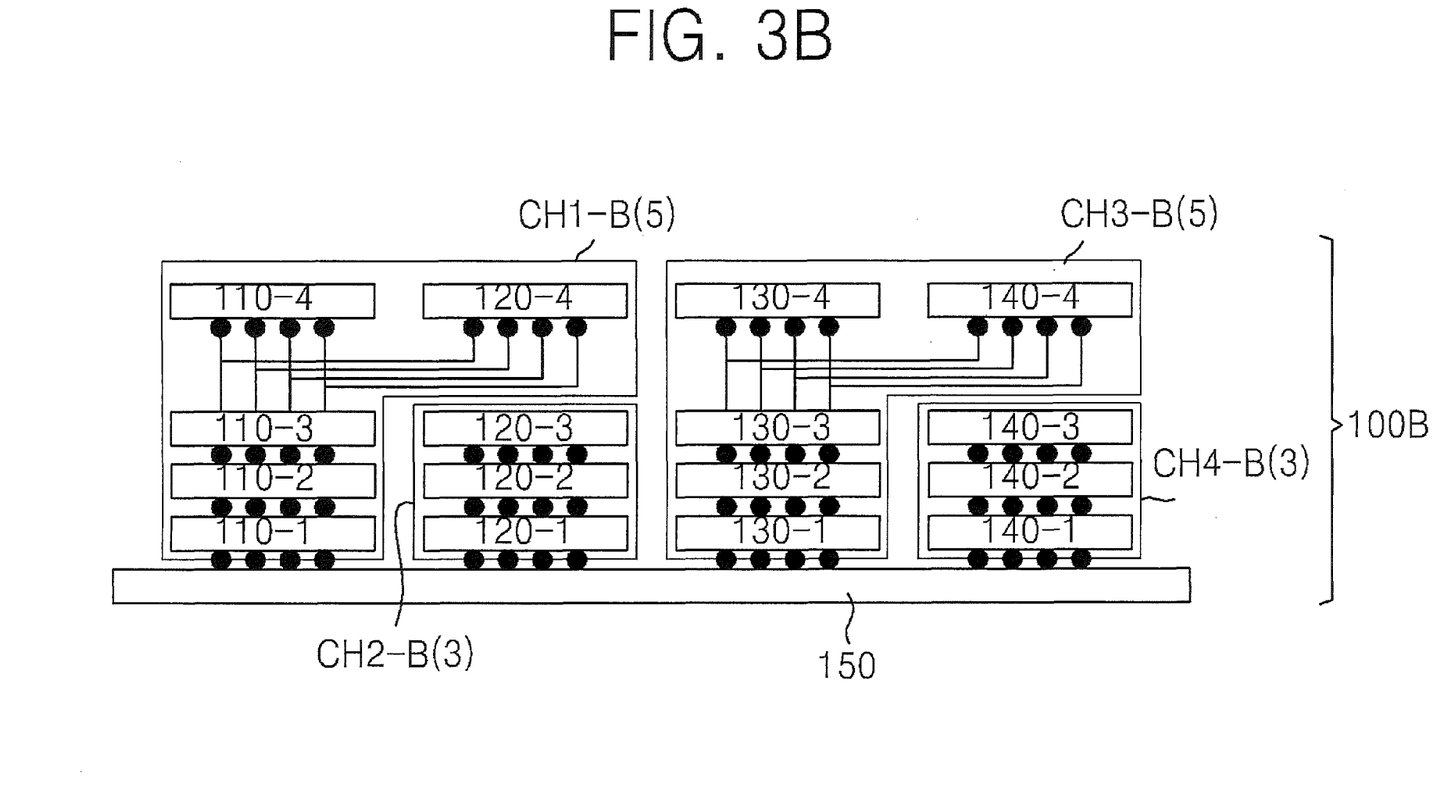

Referring to FIG. 3B, a stacked memory 100B includes a first channel CH1-B including five memory chips 110-1 through 110-4 and 120-4; a second channel CH2-B including three memory chips 120-1 through 120-3; a third channel CH3-B including five memory chips 130-1 through 130-4 and 140-4; and a fourth channel CH4-B including three memory chips 140-1 through 140-3. The memory chip 110-4 in the first group 110 is electrically connected with the memory chip 120-4 in the second group 120 and the memory chip 130-4 in the third group 130 is electrically connected with the memory chip 140-4 in the fourth group 140.

Figure 3C:
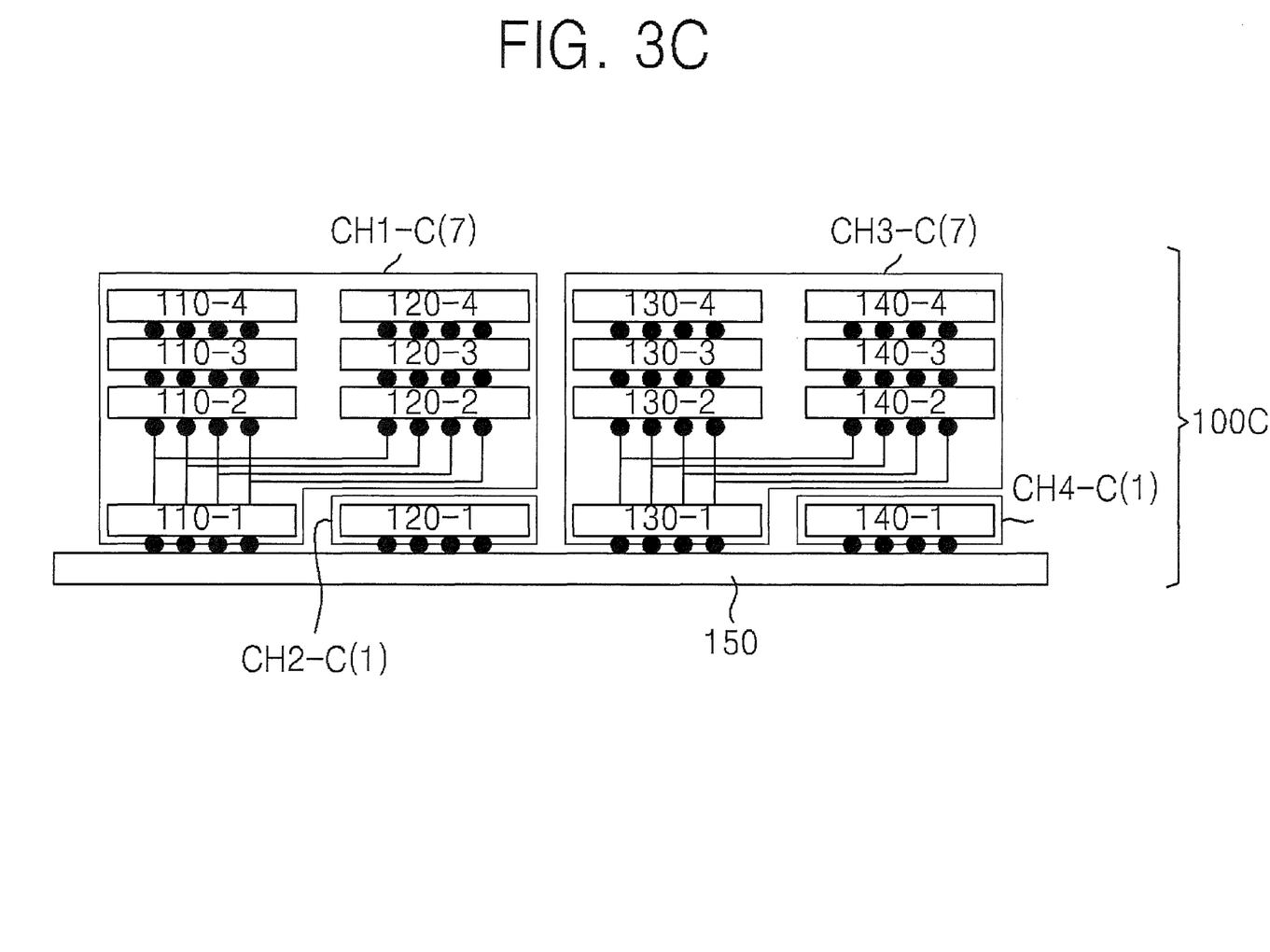

Referring to FIG. 3C, a stacked memory 100C includes a first channel CH1-C including seven memory chips 110-1 through 110-4 and 120-2 through 120-4; a second channel CH2-C including one memory chip 120-1; a third channel CH3-C including seven memory chips 130-1 through 130-4 and 140-2 through 140-4; and a fourth channel CH4-C including one memory chip 140-1. The memory chip 110-2 in the first group 110 is electrically connected with the memory chip 120-2 in the second group 120 and the memory chip 130-2 in the third group 130 is electrically connected with the memory chip 140-2 in the fourth group 140.

Figure 3D:
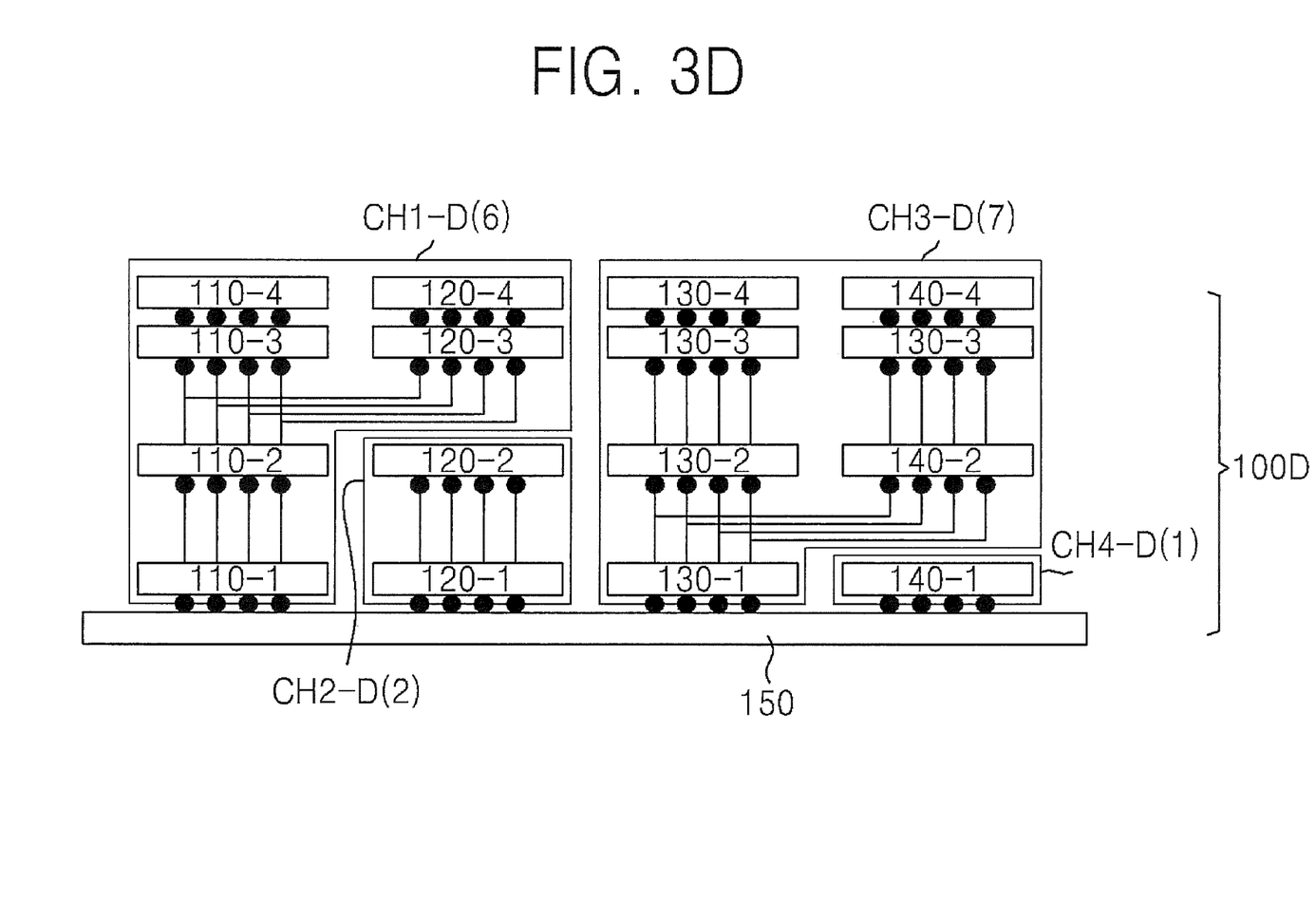

Referring to FIG. 3D, a stacked memory 100D includes a first channel CH1-D including six memory chips 110-1 through 110-4, 120-3, and 120-4; a second channel CH2-D including two memory chips 120-1 and 120-2; a third channel CH3-D including seven memory chips 130-1 through 130-4 and 140-2 through 140-4; and a fourth channel CH4-D including one memory chip 140-1. The memory chip 110-3 in the first group 110 is electrically connected with the memory chip 120-3 in the second group 120 and the memory chip 130-2 in the third group 130 is electrically connected with the memory chip 140-2 in the fourth group 140.

Figure 3E:
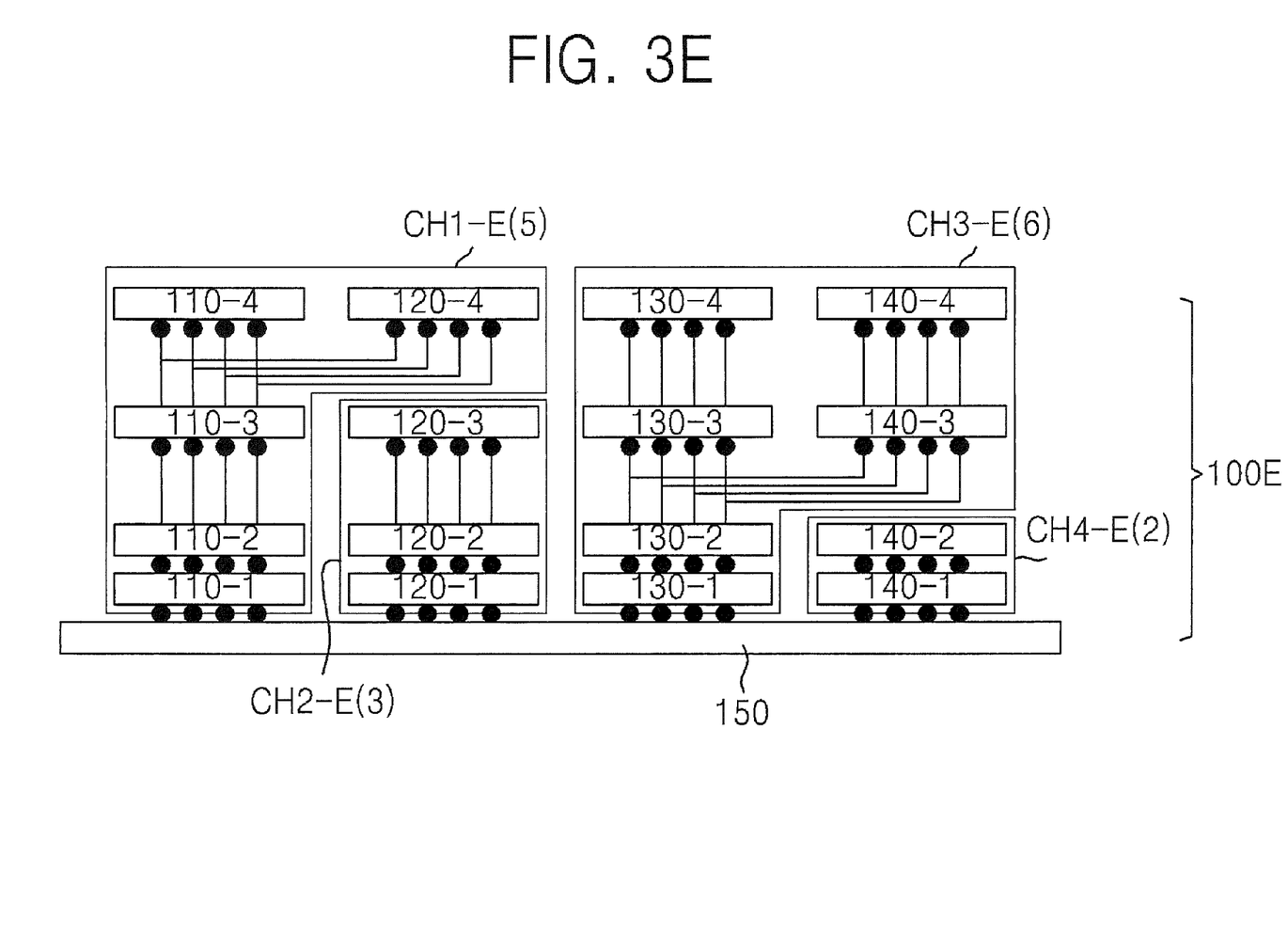

Referring to FIG. 3E, a stacked memory 100E includes a first channel CH1-E including five memory chips 110-1 through 110-4 and 120-4; a second channel CH2-E including three memory chips 120-1 through 120-3; a third channel CH3-E including six memory chips 130-1 through 130-4, 140-3, and 140-4; and a fourth channel CH4-E including two memory chips 140-1 and 140-2. The memory chip 110-4 in the first group 110 is electrically connected with the memory chip 120-4 in the second group 120 and the memory chip 130-3 in the third group 130 is electrically connected with the memory chip 140-3 in the fourth group 140.

Figure 3F:
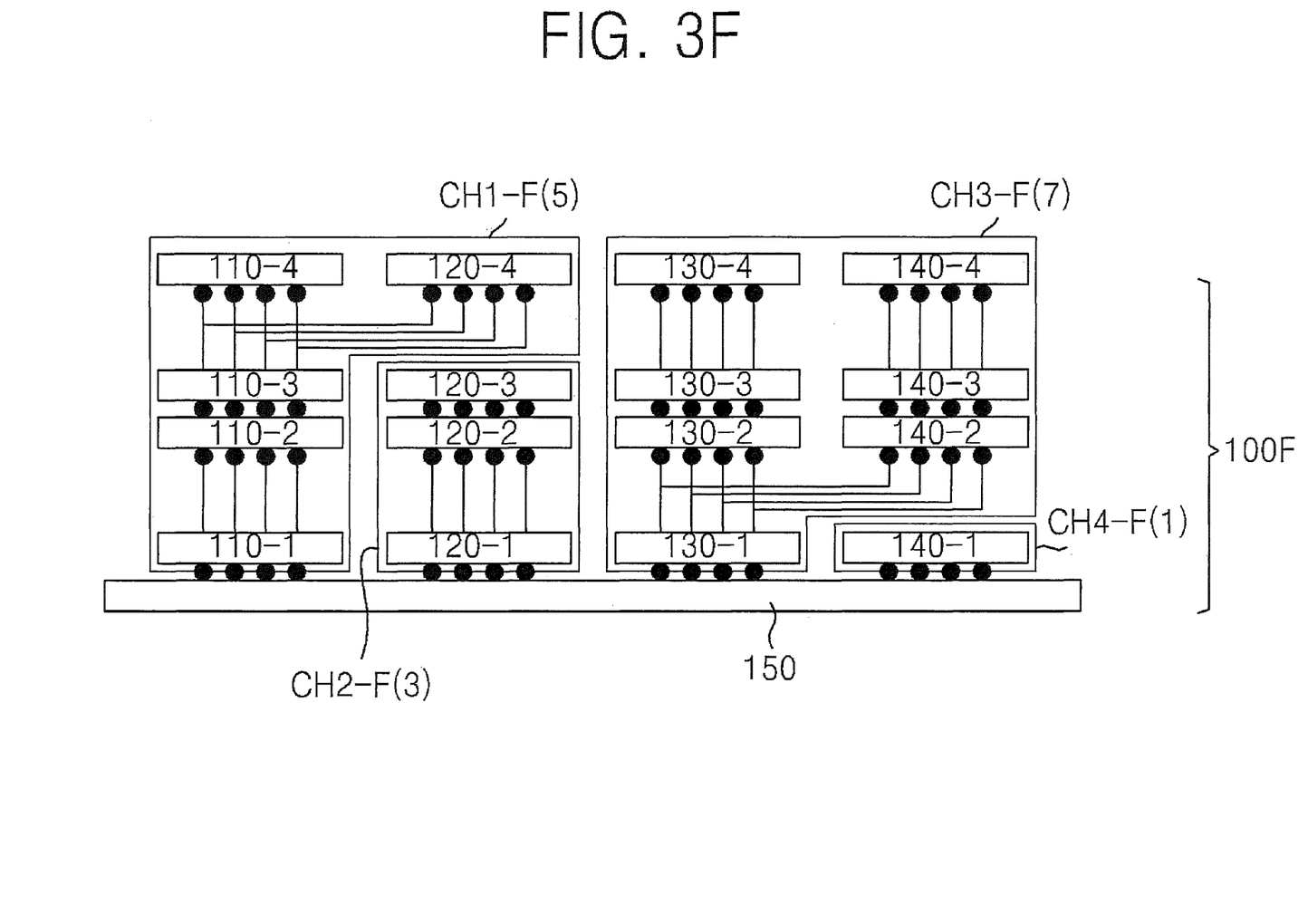

Referring to FIG. 3F, a stacked memory 100F includes a first channel CH1-F including five memory chips 110-1 through 110-4 and 120-4; a second channel CH2-F including third memory chips 120-1 through 120-3; a third channel CH3-F including seven memory chips 130-1 through 130-4 and 140-2 through 140-4; and a fourth channel CH4-F including one memory chip 140-1. The memory chip 110-4 in the first group 110 is electrically connected with the memory chip 120-4 in the second group 120 and the memory chip 130-2 in the third group 130 is electrically connected with the memory chip 140-2 in the fourth group 140.

Figure 3G:
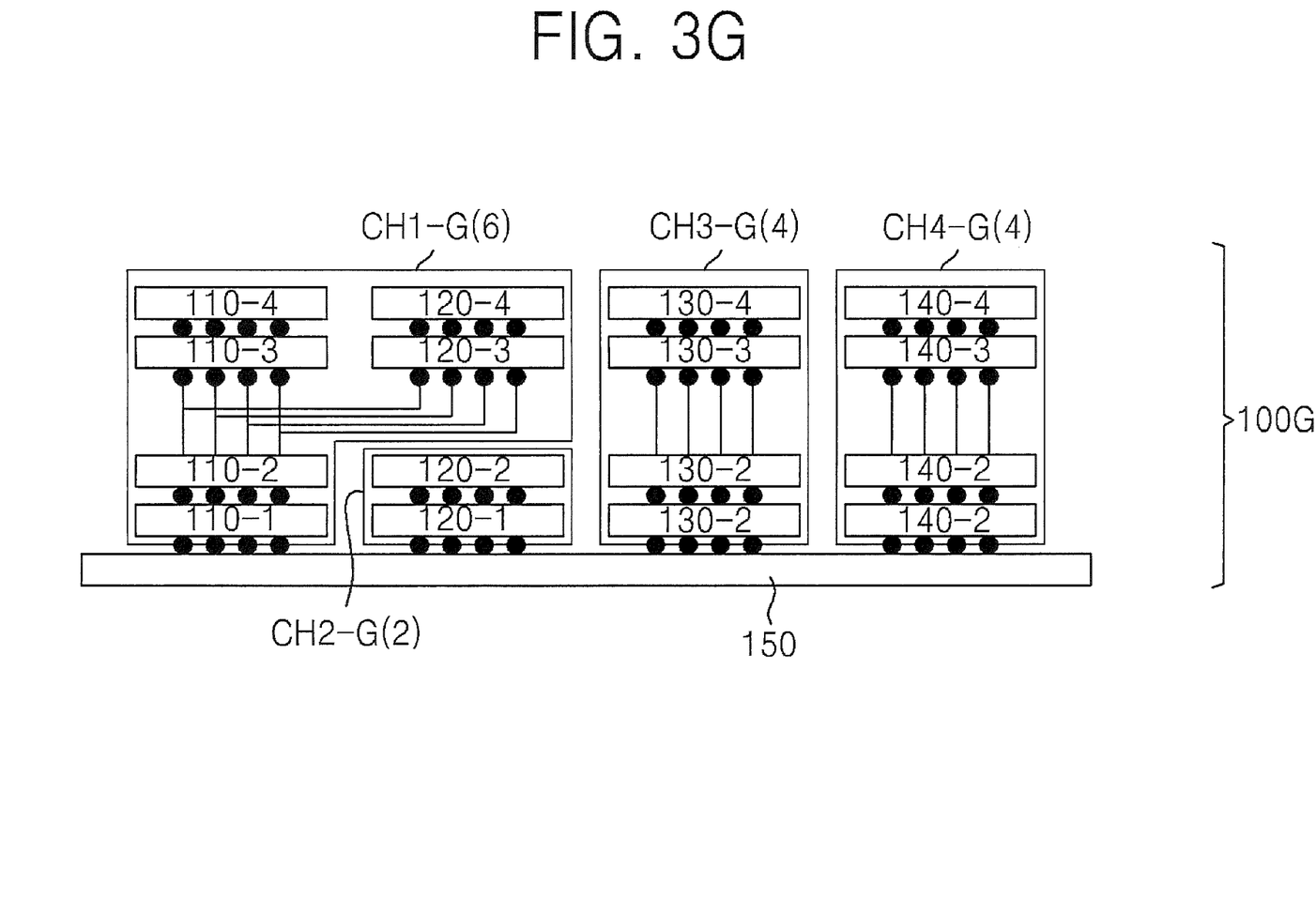

Referring to FIG. 3G, a stacked memory 100G includes a first channel CH1-G including six memory chips 110-1 through 110-4, 120-3, and 120-4; a second channel CH2-G including two memory chips 120-1 and 120-2; a third channel CH3-G including four memory chips 130-1 through 130-4; and a fourth channel CH4-G including four memory chips 140-1 through 140-4. The memory chip 110-3 in the first group 110 is electrically connected with the memory chip 120-3 in the second group 120.

Figure 3H:
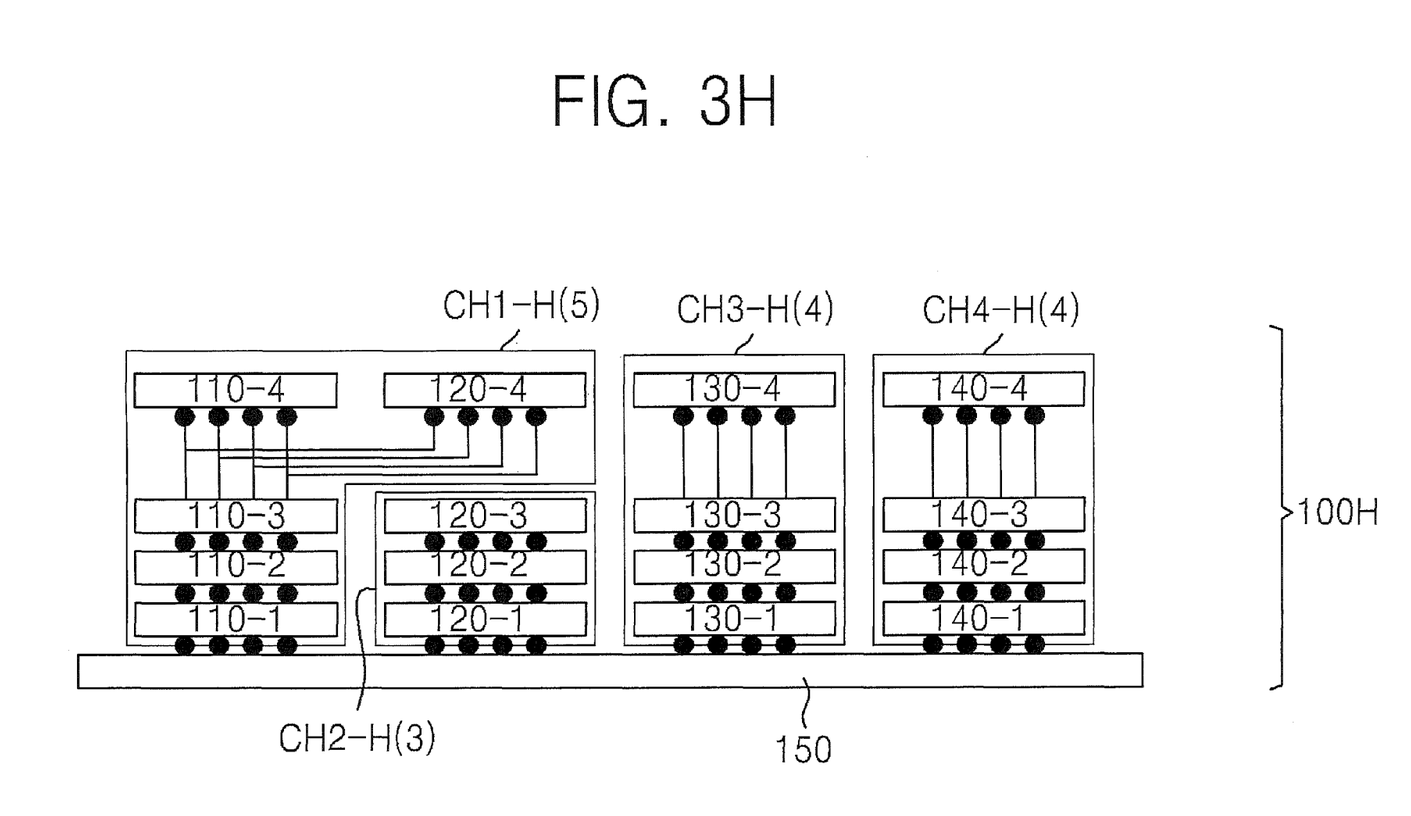

Referring to FIG. 3H, a stacked memory 100H includes a first channel CH1-H including five memory chips 110-1 through 110-4 and 120-4; a second channel CH2-H including three memory chips 120-1 through 120-3; a third channel CH3-H including four memory chips 130-1 through 130-4; and a fourth channel CH4-H including four memory chips 140-1 through 140-4. The memory chip 110-4 in the first group 110 is electrically connected with the memory chip 120-4 in the second group 120.

Figure 3I:
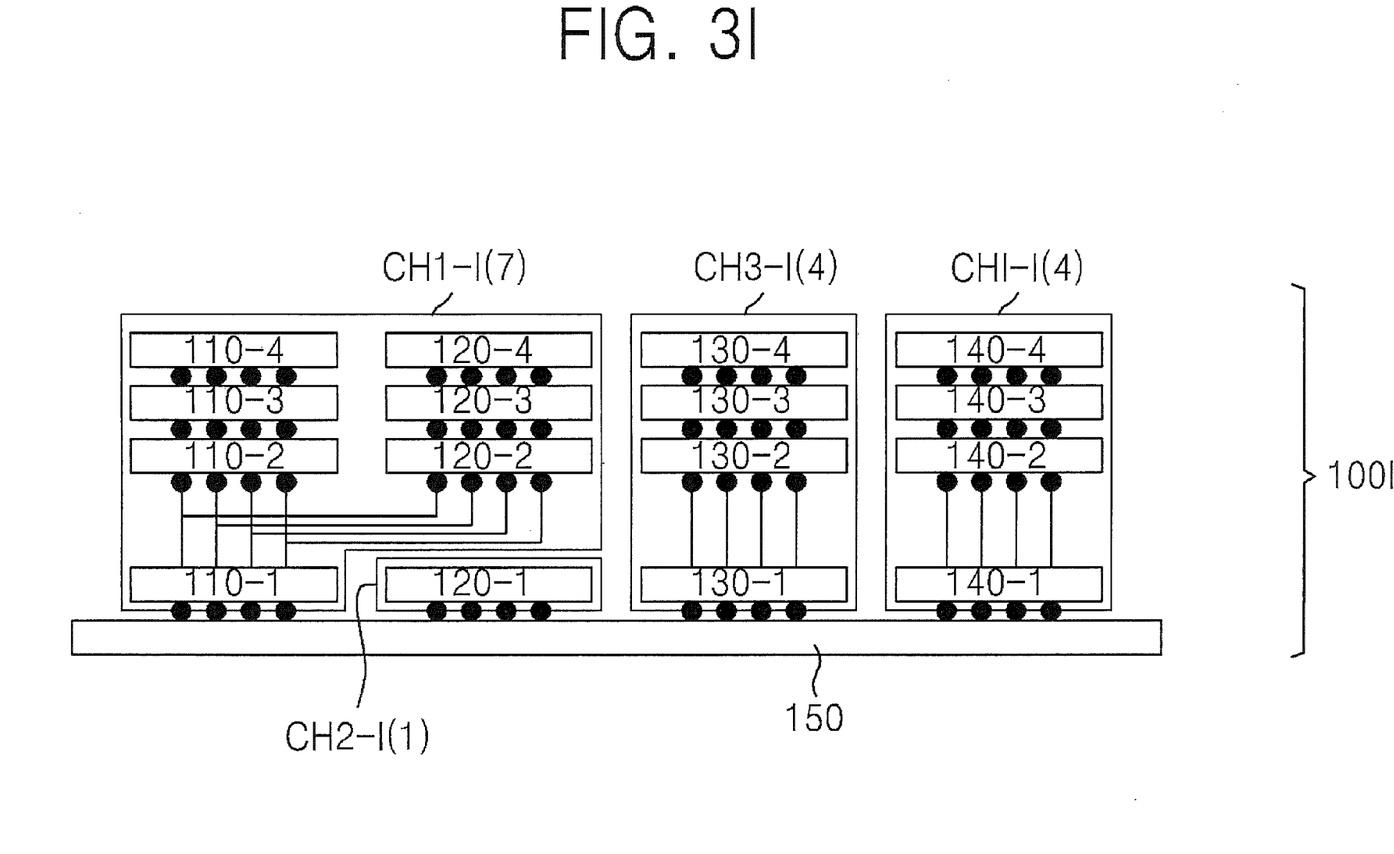

Referring to FIG. 3I, a stacked memory 100I includes a first channel CH1-I including seven memory chips 110-1 through 110-4 and 120-2 through 120-4; a second channel CH2-I including one memory chip 120-1; a third channel CH3-I including four memory chips 130-1 through 130-4; and a fourth channel CH4-I including four memory chips 140-1 through 140-4. The memory chip 110-2 in the first group 110 is electrically connected with the memory chip 120-2 in the second group 120.

Figure 4:
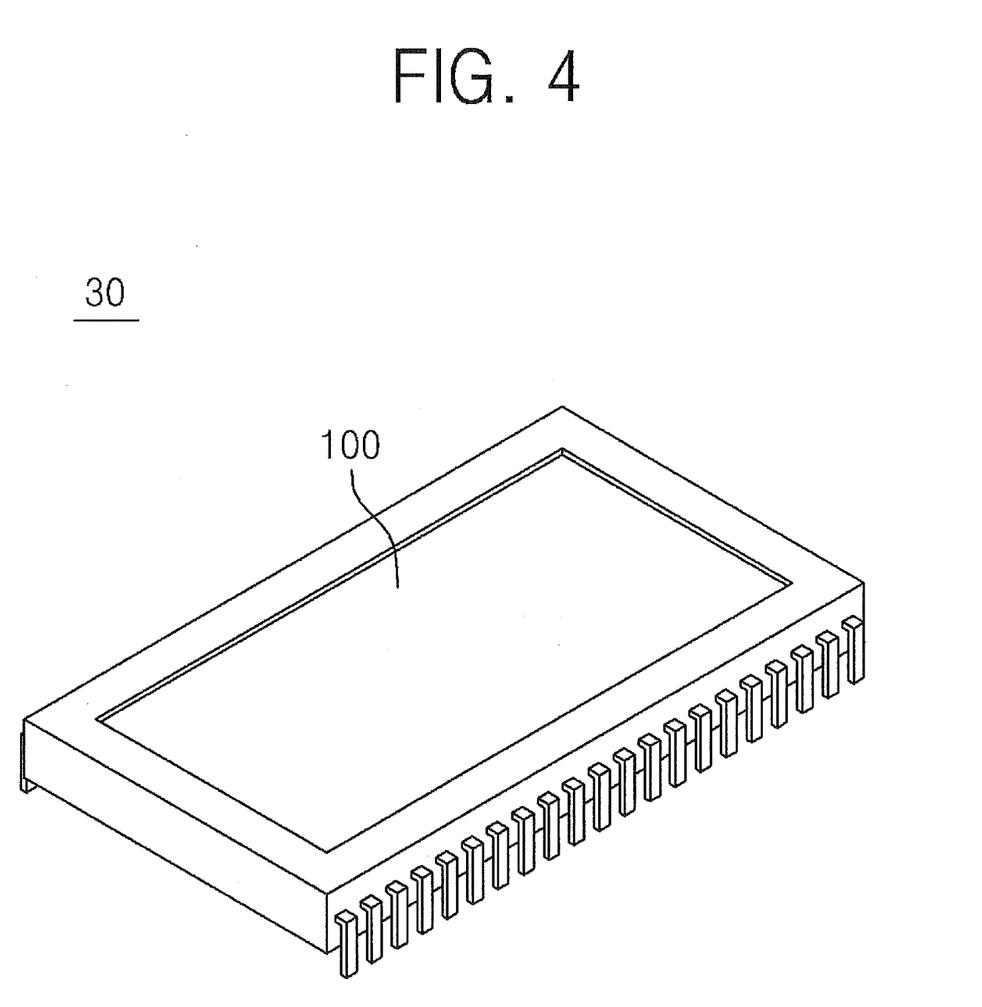
FIG. 4 is a diagram showing a multi-chip package (MCP) including a stacked memory according to example embodiments of the present invention.

FIG. 4 is a diagram showing a multi-chip package (MCP) 30 according to example embodiments of the present invention. The MCP 30 includes the stacked memories 100 and 100A through 100I (collectively denoted by 100) and connection terminals. The stacked memories 100 may be mounted on a memory module through the connection terminals.

The MCP 30 may be packaged using a package-on-package (PoP), ball grid arrays (BGAs), chip scale packages (CSPs), a plastic leaded chip carrier (PLCC), a plastic dual in-line package (PDIP), a die in waffle pack, a din in wafer form, a chip-on-board (COB), a ceramic dual in-line package (CERDIP), a plastic metric quad flat pack (MQFP), a thin quad flat pack (TQFP), a small outline integrated circuit (SOIC), a shrink small outline package (SSOP), a thin small output package (TSOP), a system in package (SIP), a wafer-level fabricated package (WFP), or a wafer-level processed stack package (WSP). The MCP 30 may be implemented in mobile communication devices such as portable computers, cellular phones, smart phones, and personal digital assistant (PDA). The MCP 30 may also be implemented in an e-book.

Figure 5:
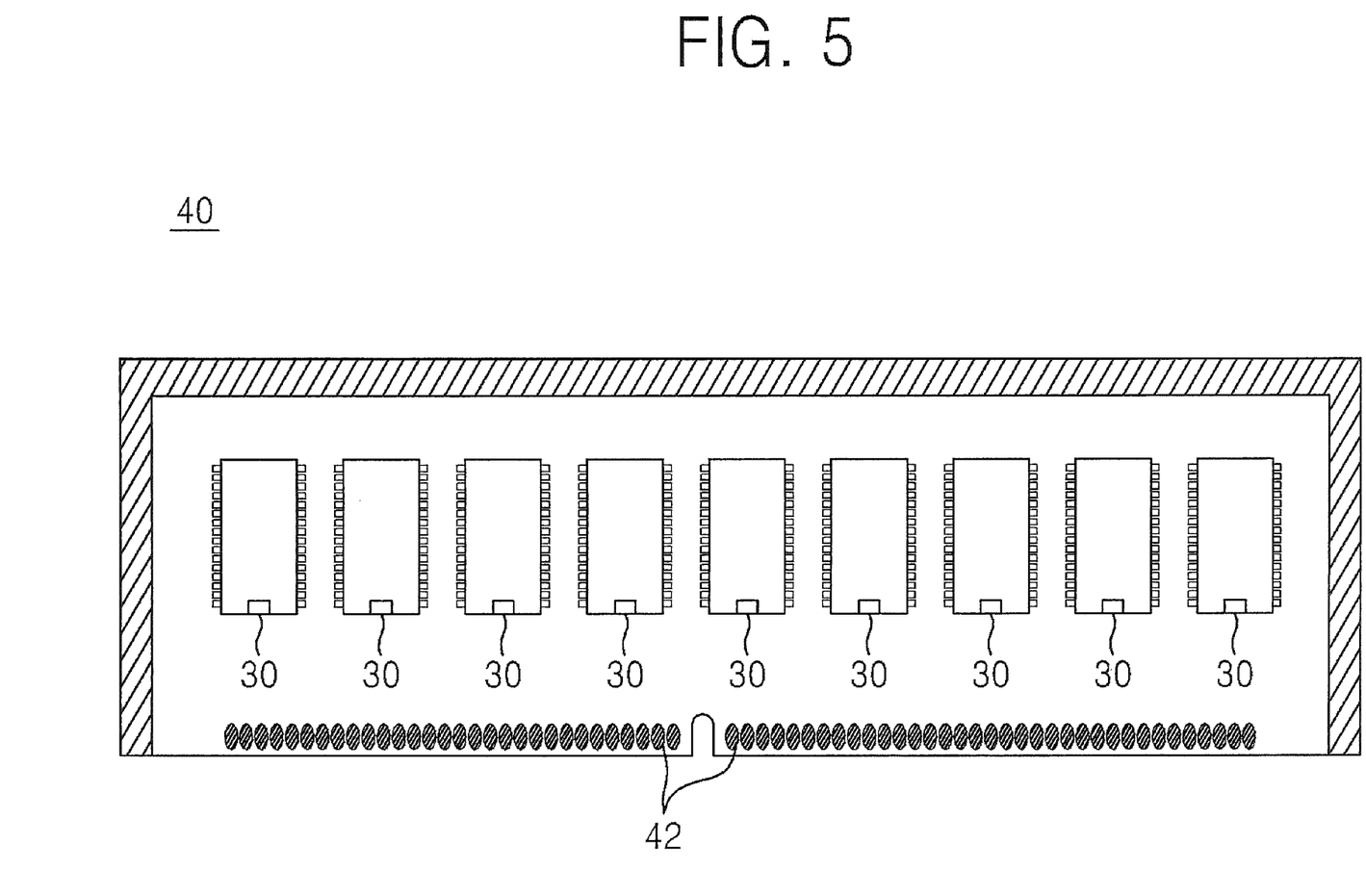
FIG. 5 is a diagram showing a memory module including the MCP illustrated in FIG. 4.

FIG. 5 is a diagram showing a memory module 40 including the MCP 30 illustrated in FIG. 4. Referring to FIG. 5, the memory module 40 includes a plurality of MCPs 30 mounted on a module board and a plurality of connection terminals 42. The connection terminals 42 are inserted into a slot. The memory module 40 may be implemented by a single inline memory module (SIMM), a dual inline memory module (DIMM), a small outline dual inline memory module (SO-DIMM), or a fully buffered DIMM (FB-DIMM).

A memory system may include the memory module 40 and at least one processor, e.g., a CPU. The processor may exchange data with at least one memory chip among the MCPs 30 mounted on the memory module 40 through a single channel. The memory system may be implemented by a computer or a portable computer.

As described above, according to example embodiments of the present invention, a stacked memory in which channels have different densities and devices including the stacked memory can be provided.

While the present invention has been particularly shown and described with reference to example embodiments thereof, it will be understood by those of ordinary skill in the art that various changes in forms and details may be made therein without departing from the spirit and scope of the present invention as defined by the following claims.

What is claimed is:

1. A stacked memory comprising:
 a first group of stacked memory chips;
 a second group of stacked memory chips; and
 connection terminals electrically connecting a first memory chip among the stacked memory chips in the first group to a second memory chip among the stacked memory chips in the second group,
 at least one memory chip among the stacked memory chips in the second group being electrically isolated from the second memory chip among the stacked memory chips in the second group.

2. The stacked memory of claim 1, wherein when a number of stacked memory chips in the first group is N and a number of stacked memory chips in the second group is N, the first memory chip and the second memory chip are an i-th memory chip in the first and second groups, respectively, where N is a natural number and $2 \leq i \leq N$.

3. The stacked memory of claim 1, wherein when a number of stacked memory chips in the second group is N and the second memory chip is an i-th memory chip in the second group, the i-th memory chip is electrically isolated from an (i−1)-th memory chip in the second group, where N is a natural number and $2 \leq i \leq N$.

4. The stacked memory of claim 3, wherein the stacked memory chips in the first group are electrically connected to one another through a plurality of first through silicon vias (TSVs) and the i-th through N-th memory chips among the stacked memory chips in the second group are electrically connected to one another through a plurality of second TSVs.

5. The stacked memory of claim 1, wherein the stacked memory chips in the first group and the stacked memory chips in the second group have a same chip configuration.

6. The stacked memory of claim 1, further comprising a circuit board configured to transfer data to the stacked memory chips in the first group and the stacked memory chips in the second group and transfer data from the stacked memory chips in the first group and the stacked memory chips in the second group.

7. A multi-chip package comprising:
 the stacked memory of claim 1; and connection terminals configured to connect the stacked memory to an external device.

8. A memory module comprising:
the stacked memory of claim 1; and
a module board on which the stacked memory is mounted.

9. A memory system comprising:
a stacked memory comprising N stacked first memory chips and N stacked second memory chips where N is a natural number;
a first central processing unit (CPU) configured to access "j" memory chips among the N stacked first memory chips and the N stacked second memory chips where "j" is a natural number and $1 \leq j \leq N$; and
a second CPU configured to access (N−j) memory chips among the N stacked second memory chips,
wherein the "j" memory chips among the N stacked second memory chips accessed by the first CPU are electrically isolated from the (N−j) memory chips among the N stacked second memory chips accessed by the second CPU.

10. The memory system of claim 9, wherein the stacked memory further comprises a connection terminal electrically connecting an i-th memory chip among the N stacked first memory chips to an i-th memory chip among the N stacked second memory chips where $2 \leq i \leq N$.

11. A semiconductor device, comprising:
a first group of stacked semiconductor chips, the first group including a first semiconductor chip; and
a second group of stacked semiconductor chips, the second group including a second semiconductor chip and a third semiconductor chip, the second and third semiconductor chips being electrically isolated from each other, wherein the first semiconductor chip is electrically connected to the second semiconductor chip.

12. The semiconductor device of claim 11, wherein if a number of stacked semiconductor chips in the first group is N and a number of stacked semiconductor chips in the second group is N, the first semiconductor chip and the second semiconductor chip are an i-th semiconductor chip in the first and second groups and the third semiconductor chip is an (i−1)-th memory chip in the second group, where N is a natural number and $2 \leq i \leq N$.

13. The semiconductor device of claim 12, wherein the stacked semiconductor chips in the first group are electrically connected to one another through a plurality of first through silicon vias (TSVs) and the i-th through N-th semiconductor chips among the stacked semiconductor chips in the second group are electrically connected to one another through a plurality of second TSVs.

14. The semiconductor device of claim 11, wherein the stacked semiconductor chips in the first group and the stacked semiconductor chips in the second group have a same chip configuration.

15. The semiconductor device of claim 11, further comprising:
a circuit board configured to transfer data to the stacked semiconductor chips in the first group and the stacked semiconductor chips in the second group and transfer data from the stacked semiconductor chips in the first group and the stacked semiconductor chips in the second group.

16. The semiconductor device of claim 11, further comprising:
first connection terminals electrically connecting the first semiconductor chip to the second semiconductor chip.

17. The semiconductor device of claim 16, wherein the first and second semiconductor chips include solder balls and the first connection terminals are wires connecting the solder balls of the first semiconductor chip to the solder balls of the second semiconductor chip.

18. The semiconductor device of claim 11, further comprising:
a first controller configured to access the first and second semiconductor chips; and
a second controller configured to access the third semiconductor chip.

19. The semiconductor device of claim 18, wherein the third semiconductor chip is arranged between the second semiconductor chip and the second controller.

20. The semiconductor device of claim 18, wherein the second group includes a fourth semiconductor chip electrically connected to the third semiconductor chip and a fifth semiconductor chip electrically connected to the second semiconductor chip and the first controller is further configured to access the fifth semiconductor chip and the second controller is further configured to access the fourth semiconductor chip.

* * * * *